United States Patent [19]
Broadbent et al.

[11] Patent Number: 5,188,717
[45] Date of Patent: Feb. 23, 1993

[54] SWEEPING METHOD AND MAGNET TRACK APPARATUS FOR MAGNETRON SPUTTERING

[75] Inventors: Eliot K. Broadbent, San Jose; Kenneth C. Miller, Mountain View, both of Calif.

[73] Assignee: Novellus Systems, Inc., San Jose, Calif.

[21] Appl. No.: 760,027

[22] Filed: Sep. 12, 1991

[51] Int. Cl.[5] .............................................. C23C 14/34
[52] U.S. Cl. ......................... 204/192.12; 204/298.19; 204/298.2
[58] Field of Search ...................... 204/192.12, 298.19, 204/298.2

[56] References Cited

U.S. PATENT DOCUMENTS

| | | | |
|---|---|---|---|
| 4,714,536 | 12/1987 | Freeman et al. | 204/298.2 |
| 4,872,964 | 10/1989 | Suzuki et al. | 204/298.2 |
| 4,995,958 | 2/1991 | Andersen et al. | 204/298.2 |

Primary Examiner—Nam X. Nguyen
Attorney, Agent, or Firm—Skjerven, Morrill, MacPherson, Franklin & Friel

[57] ABSTRACT

A magnetism sputtering apparatus is provided with a movable magnetic track which is a closed curve essentially in the shape of a kidney bean, the closed curve being generated in part by a spiral curve. The magnet track is positioned behind the target of the sputtering apparatus, and it is simultaneously rotated about a center of rotation and caused to oscillate substantially radially with respect to said center of rotation. The combined rotational and oscillatory motion provides a substantially uniform magnetic flux over a major annular portion of the target while ensuring that some degree of sputtering occurs in all regions of the target, including regions near the center and periphery of the target. This arrangement has been found suitable for providing a highly uniform deposition of target material on large diameter substrates.

21 Claims, 13 Drawing Sheets

SWEEPING METHOD AND MAGNET TRACK APPARATUS FOR MAGNETRON SPUTTERING

BACKGROUND OF THE INVENTION

1. Field of the Invention

The present invention relates to planar magnetron sputtering, and more specifically, to a magnet track and a sweeping method for planar magnetron sputtering.

3. Description of Related Art

Sputtering describes a number of physical techniques commonly used in, for example, the semiconductor industry for the deposition of thin films of aluminum and aluminum alloys, refractory metal silicides, gold, copper, titanium-tungsten, tungsten, molybdenum, and less commonly, silicon dioxide and silicon on an item, for example, a wafer during processing. In general, the techniques involve producing a gas plasma of ionized inert gas "particles" (atoms or molecules) by using an electrical field in an evacuated chamber. The ionized particles are then directed toward an electrically-biased target and collide with it. As a result of the collisions, free atoms of the target material are released from the surface of the target, essentially converting the target material to its gas phase. A portion of the free atoms which escape the target surface condense and form (deposit) a thin film on the surface of the wafer, which is located a short distance in front of the target.

One common sputtering technique is magnetron sputtering. Magnetron sputtering uses a magnetic field to concentrate the sputtering action so that it occurs at a higher rate and a lower process pressure. The magnets are normally positioned behind the target, with their north-south axes parallel to the surface of the target. Alternatively, magnet pairs may be oriented with their axes perpendicular to the surface of the target, the magnets in each pair having their north and south poles, respectively, directed towards the target. With either orientation, the lines of the magnetic field penetrate the target and form arcs over its surface. The magnetic field helps to capture free electrons in an area near the surface of the target. The resulting increased concentration of free electrons produces a greater density of inert gas ions and enhances the efficiency of the sputtering process.

If the magnet generating the magnetic field is stationary, then continuous sputtering will generate a hot spot and consume the sputtering target thickness at that location quickly. To avoid contaminating the wafer, the sputtering must be stopped before the wear pattern has consumed the full thickness of the target material at any point. If any point on the target plate behind the target is reached, sputtering of the target backplate material (usually copper) will occur, contaminating the vacuum chamber and the wafer with copper. Because the pattern of target utilization is normally not uniform, in practice sputtering must be stopped when a significant percentage of the target still remains.

In designing the target and its associated magnetic field, two main objectives are a uniform erosion of the target and uniform deposition of target material on the wafer. To increase the uniformity of target erosion and thereby improve target utilization, magnets in a magnet housing have been moved in various oscillatory patterns. These techniques may provide greater target utilization than stationary magnets, but they also produce grooves, racetracks or other non-uniform wear patterns as the target is consumed. The non-uniform target utilization takes place because the magnets and their associated magnetic field, as they are configured and moved, do not dwell uniformly over the target. Ideally, to produce uniform target erosion, the magnetic field should remain for an equal amount time over each unit (e.g., square cm) of the target's area. This is referred to as the "dwell time" of the magnetic flux. When the target is circular, which is usually the case, and the magnet is rotated about the center of the target, the equalization of dwell times requires that the magnetic field be present for proportionally greater periods of time near the periphery of the target than near its center. This is because the amount of area enclosed within a given annular segment of the target increases with increasing radius.

Another important design objective is to insure that some degree of sputtering occurs in all areas of the target. Otherwise, target material which is "back scattered" and redeposited on the target surface in areas where sputtering does not occur may form relatively loose accumulations (flakes) which can become detached from the target and contaminate the wafer.

One approach using a fixed-magnet sputtering apparatus is described in U.S. Pat. No. 4,680,061, issued Jul. 14, 1987, to Lamont, and U.S. Pat. No. 4,100,055, issued Jul. 11, 1978 to Rainey. The target is shaped like a ring, which is said to provide good deposition uniformity without using relative movement between the source and the wafer, as had previously been done.

Another approach involving a magnetic field source in a planar magnetron sputtering apparatus is described in U.S. Pat. No. 4,444,643, issued Apr. 24, 1984, to Garrett. In contrast to fixed magnetron sputtering apparatus, the Garrett apparatus moves a magnetic field source across the non-vacuum side of the target to sweep magnetic flux lines over the target surface. Since maximum erosion of a target occurs where lines of magnetic flux are parallel with the surface of the target, the sweeping is said to avoid the "racetrack" grooves found in prior sputtering devices having fixed magnetic field sources, and thereby provides greater uniformity of target erosion. The magnetic field source of Garrett's apparatus includes a magnet and ring subassembly, the magnetically permeable ring thereof having a plurality of permanent magnets arranged radially inward from the inner circumference of the ring and in paired symmetry. The axial arrangement of the magnets is said to cause the creation of a series of loop pairs of flux in planes normal to the plane of the target and long diameters through the paired magnets.

Another swept field approach is described in U.S. Pat. No. 4,714,536, issued Dec. 22, 1987 to Freeman et al. The magnet assembly of Freeman et al. is rotated about a central axis relative to the target surface and simultaneously rotated about a second axis spaced being the central axis, with the magnet assembly being mounted off-center with respect to the second axis. The resulting pattern is said to be essentially an epicycloid, which is displaced throughout the axis of rotation with each successive revolution. The particular path traced by the magnet assembly is dependent upon the radii and gear ratios of the driving motor assembly. The magnet assembly itself contains permanent magnets mounted with their north-south axes aligned with radii of the cup-shaped holder, such that the north pole of each of the magnets is adjacent to the center of the holder.

Our copending application 07/632,444, filed Dec. 21, 1990, abandoned, describes an arrangement in which a magnet track in the form of a closed curve having at least one cusp and at least one loop is rotated behind the surface of the target while varying the instantaneous center of rotation. This arrangement has been formed to provide a high degree of uniformity of erosion in an annular region of the target.

Conventional cooling methods in prior art sputtering devices employ a cavity behind or internal to a plate being heated by sputtering; see, e.g., the patents to Lamont, Rainey, Garrett and Freeman et al. mentioned above, as well as U.S. Pat. No. 3,956,093 issued May 11, 1976 to McLeod; U.S. Pat. No. 4,116,806 issued Sep. 26, 1978 to Love et al.; and U.S. Pat. No. 4,175,030 issued Nov. 20, 1979 to Love et al. In these patents, water or another liquid coolant is provided through an opening to internal passages of the device or a cavity in the device. A separate opening allows the coolant to be discharged from the device. The devices having internal passages route the coolant through these passages, which are adjacent to the heat generating elements of the device, to cool them. In devices where the coolant is routed to a cavity, the direction of the flow of coolant as well as the movement of a mechanism inside the cavity contributes to the agitation of the coolant as it cools the heat generating elements before the coolant exits the cavity. These prior art methods for cooling devices having internal cavities sometimes create large and often random differences in actual coolant flow and in the temperature of the target plate from one side to the other. The coolant chamber is pressurized as coolant flows. Pressurizing the cavity in contact with the target plate requires that it be strengthened, because the pressure within the coolant chamber when added to the vacuum pressure in the evacuated sputtering cavity provides a large differential pressure across the target plate. The target plate must be sized to support this large differential pressure.

Cooling has also been accomplished by drilling gun bore-type channels in the target backing plate similar to the fixed cooling passages in the prior art. The location of these channels causes localized hot spots between the channels, however, and temperature increases away from the location of coolant flow. Also, drilling, locating and connecting piping to these channels unnecessarily complicates the construction of the target backing plate.

The distance between the magnets and the surface of the target affects the degree to which sputtering is concentrated by the magnet's magnetic field. For a given magnet design, a short distance causes sputtering to be more highly concentrated than a greater distance. The highest sputtering concentration occurs if a target having a negligible thickness is mounted directly on the magnets. Every additional increment of distance between the surface of the target and the magnet reduces the influence of the magnetic field upon sputtering of the target. A thick target backing plate is necessary in a pressurized coolant chamber device to obtain the additional strength needed to support the pressure behind the target backing plate, and it is particularly necessary in a device using a target backing plate which has been drilled for cooling and therefore requires additional thickness for strength. The use of a thick target backing plate adds extra thickness to the target plate assembly. To avoid a reduction in magnetic flux at the target's surface, a thin target must be substituted to maintain the same distance between the magnets and the target's surface. Alternatively, a reduced magnetic flux at the target surface, as a result of the increased distance between the magnets and the surface of the target, must be accepted. Therefore, the need to increase the thickness of the target backing plate to provide more strength is in conflict with the desire to reduce the distance between the surface of the target and the magnets to concentrate the location of sputtering.

Despite considerable improvement in the engineering of targets and magnetic field sources for planar magnetron sputtering equipment, uniform erosion of the target and uniform deposition of pure target material on the wafer have not been totally achieved. There is a particular need to provide a highly uniform deposition where the sputtered material is to be deposited on a large diameter wafer.

SUMMARY OF THE INVENTION

The present invention is suitable for achieving an acceptable erosion pattern over a target used in magnetron sputtering, while providing a highly uniform deposition pattern on a large diameter wafer.

In an embodiment of the invention, a magnet track apparatus is provided for creating a magnetic flux over a target. The magnet track selected for this embodiment has a form in the shape of a kidney bean with a single cusp. Means are provided for circularly rotating this magnet track behind the planar target with the plane of the magnet track parallel to the target. Additionally, means are provided for causing the magnet track to oscillate or "wobble". The combined effect of these motions yields a substantially uniform magnetic flux dwell time in each region of the target. The oscillation produces a degree of target center erosion sufficient to avoid the flaking of back scattered target material from the center while preventing premature target center erosion.

DETAILED DESCRIPTION OF THE DRAWINGS

DETAILED DESCRIPTION OF THE INVENTION

Figure 1:
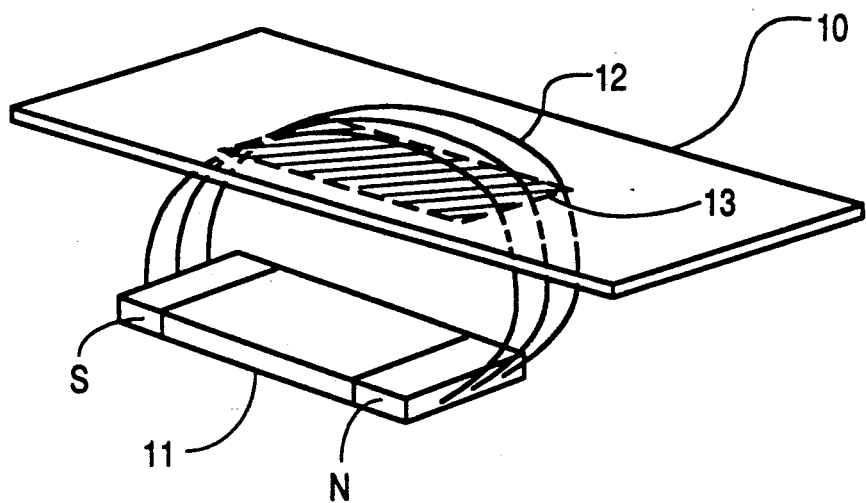
FIG. 1 is a view illustrating the intersection of magnetic lines of force with a target.

FIG. 1 shows in schematic form a target 10 overlying a magnet 11. Magnetic lines of force 12 originate from the respective north and south poles of the magnet and pass through target 10, thereby enclosing an area designated 13 on the surface of target 10. The magnetic field captures a large population of free electrons near the target surface, which in turn collide with atoms or molecules of the inert gas, thereby producing an increased concentration of inert gas ions. These are attracted to the electrically-biased target 10 where they knock target atoms or molecules into a gaseous state for deposition on a wafer. Area 13 therefore represents the area of target 10 in which the sputtering process would be enhanced by the presence of magnet 11, since it is adjacent to the volume of plasma overlying area 13 where an increased concentration of inert gas ions would stimulate the sputtering of atoms in target 10.

Figure 2:
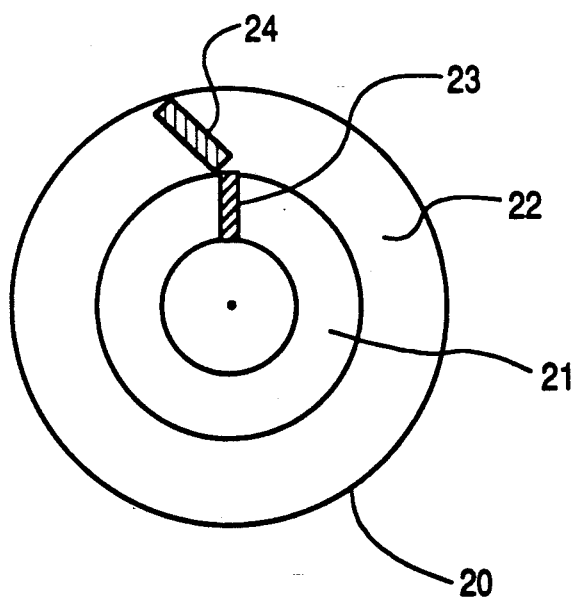
FIG. 2 is a view illustrating a manner of equalizing magnetic flux dwell time at locations at varying distances from the center of a target.

FIG. 2 shows schematically a circular target 20 having concentric annular zones 21 and 22. The radial distance between the inner and outer boundaries of zones 21 and 22 is equal. Areas 23 and 24 are comparable to area 13 in FIG. 1 in that they represent regions in which sputtering is stimulated by the presence of magnets (not shown) underneath target 20. Assume that areas 23 and 24 are to rotate about the center of target 20, and that the target utilization or erosion profile in zones 21 and 22 is desired to be the same. Since the area of zone 22 is greater than the area of zone 21, it is clear that area 24 must be greater than area 23 by the same proportion. This will mean that on the average each unit of area within respective zones 21 and 22 will experience the effect of a magnetic field for the same amount of time. Assuming that areas 23 and 24 have the same width, the length of area 24 must exceed the length of area 23 by the same proportion as the area of zone 22 exceeds the area of zone 21. As a result, area 24 must be tilted in a direction away from a radius of target 20, as shown in FIG. 2.

The following equation satisfies the foregoing condition infinitesimally:

$$\theta = \sin^{-1}\left(\frac{1}{r}\right) + \sqrt{r^2 - 1} + C$$

plotted in polar coordinates, where r is the radius, and $\theta$ is the angle (in radians) and C is a constant representing the starting angle (in radians). The curve defined by the foregoing equation is plotted in FIG. 3, with $C = -\pi/2$. This curve has the characteristic that for any concentric annular region about the origin, the segment of the curve within that region will have a length proportional to the area of the region.

In order for improved sputtering to occur, the area under the magnetic field lines (see FIG. 1) must be closed. Otherwise, the dense free electron population captured by the field will escape from the "ends" of the field, i.e., the plasma region overlying the sides of the area which are parallel to the magnetic lines. Thus it is necessary to close the figure shown in FIG. 3. This has been done by allowing $\theta$ to increase from 0° to 270° ($3\pi/2$ radians) and then closing the ends of the curve so generated by creating a curve which approximates the condition of the basic curve, i.e., that segments within any annular zones are proportional in length to the areas of the zones. This "free hand" section is shown in dashed-lines in FIG. 3, yielding a kidney bean shaped figure.

Figure 3:
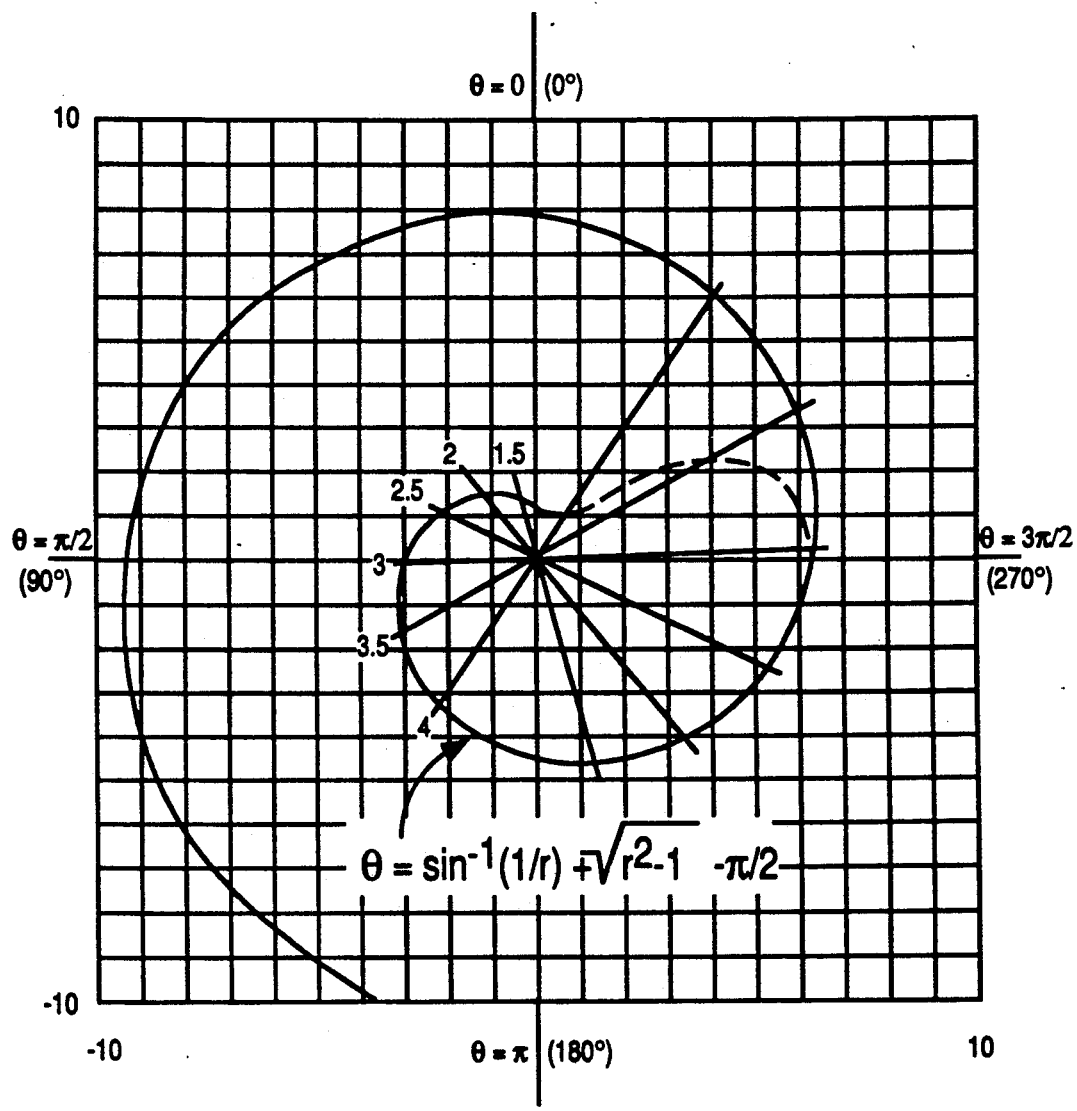
FIG. 3 is a view showing the curve from which the shape of the magnet track of the invention is derived.
Figure 4:
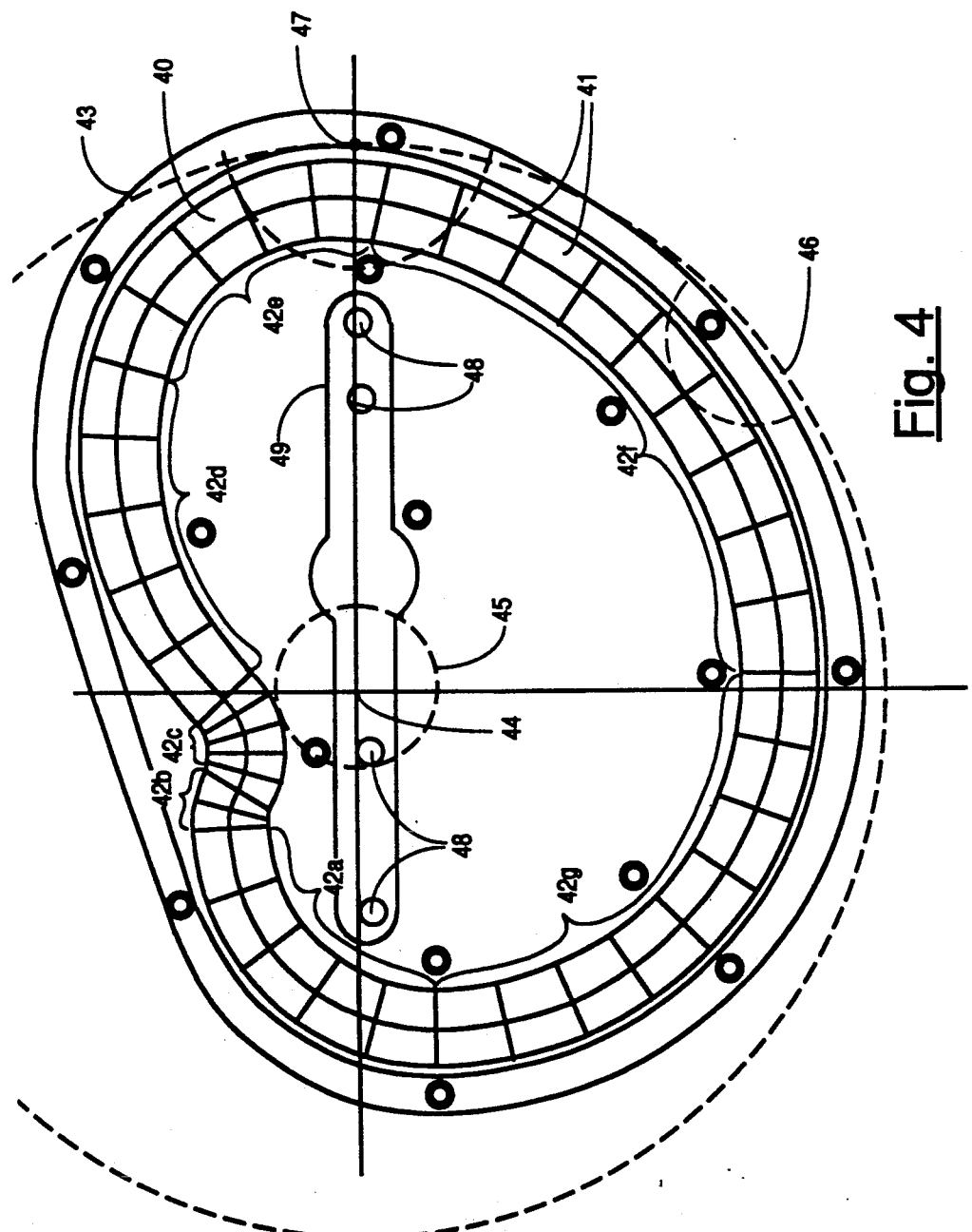
FIG. 4 is a plan view of the magnet track of the invention.

FIG. 4 is a plan view of a magnet track 40 which is formed in the kidney bean shape shown in FIG. 3. Central axis 44 is the central axis of the target (not shown), the central axis being perpendicular to the plane of the drawing. Magnet track 40 consists of individual magnets 41 which are placed side by side with their respective south poles directed inward and their respective north poles directed outward. Magnets 41 fall into subgroups 42a through 42g, the magnets in each subgroup having the same shape. Magnet track 40 is housed in a magnet housing assembly 43, which is described in greater detail below.

Figure 5:
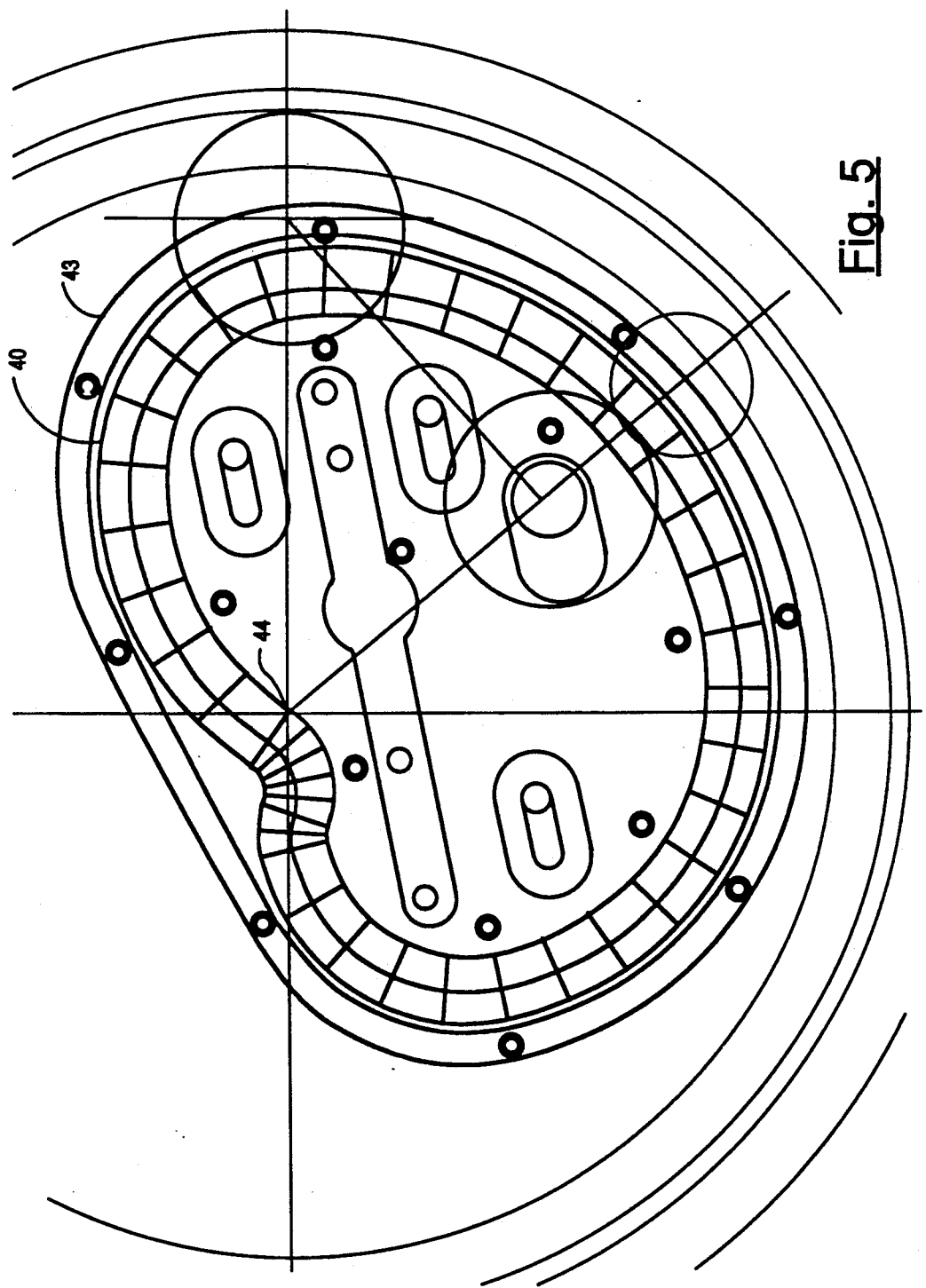
FIG. 5 is a plan view of the magnet track in the "swept in" extreme of its oscillatory motion.

It is apparent from FIG. 4 that rotation of magnet track 40 about central axis 44 provides reasonably equivalent magnetic flux dwell times throughout the annular zone defined by circles 45 and 46. With this rotational motion alone, however, the area inside circle 45 will experience no sputtering, and flaking may occur. As described above, flaking takes place when loose accumulations formed by back-scattered and redeposited material break off from the target and contaminate the wafer. It is extremely important that this condition be avoided. On the other hand, magnet track 40 cannot be designed so that it intersects the center of rotation (central axis 44) because a hot spot would then occur at the center of rotation and the target would quickly be consumed at that location. To overcome this problem, magnet track 40 is oscillated or "wobbled" about a center of rotation located at a pivot point 47 in FIG. 4. This oscillation brings the innermost portion of magnet track 40 (where it is adjacent circle 45) inward until it touches central axis 44. This is referred to as the "swept in" position, and it is shown in FIG. 5. The position of magnet track 40 shown in FIG. 4 is referred to as the "swept out" position. Thus, as magnet track 40 rotates about central axis 44, it oscillates about point 47 between the "swept out" position shown in FIG. 4 and the "swept in" position shown in FIG. 5.

The mechanism for providing this combined rotational and oscillatory motion will now be described, with reference to FIGS. 6-12.

Figure 6:
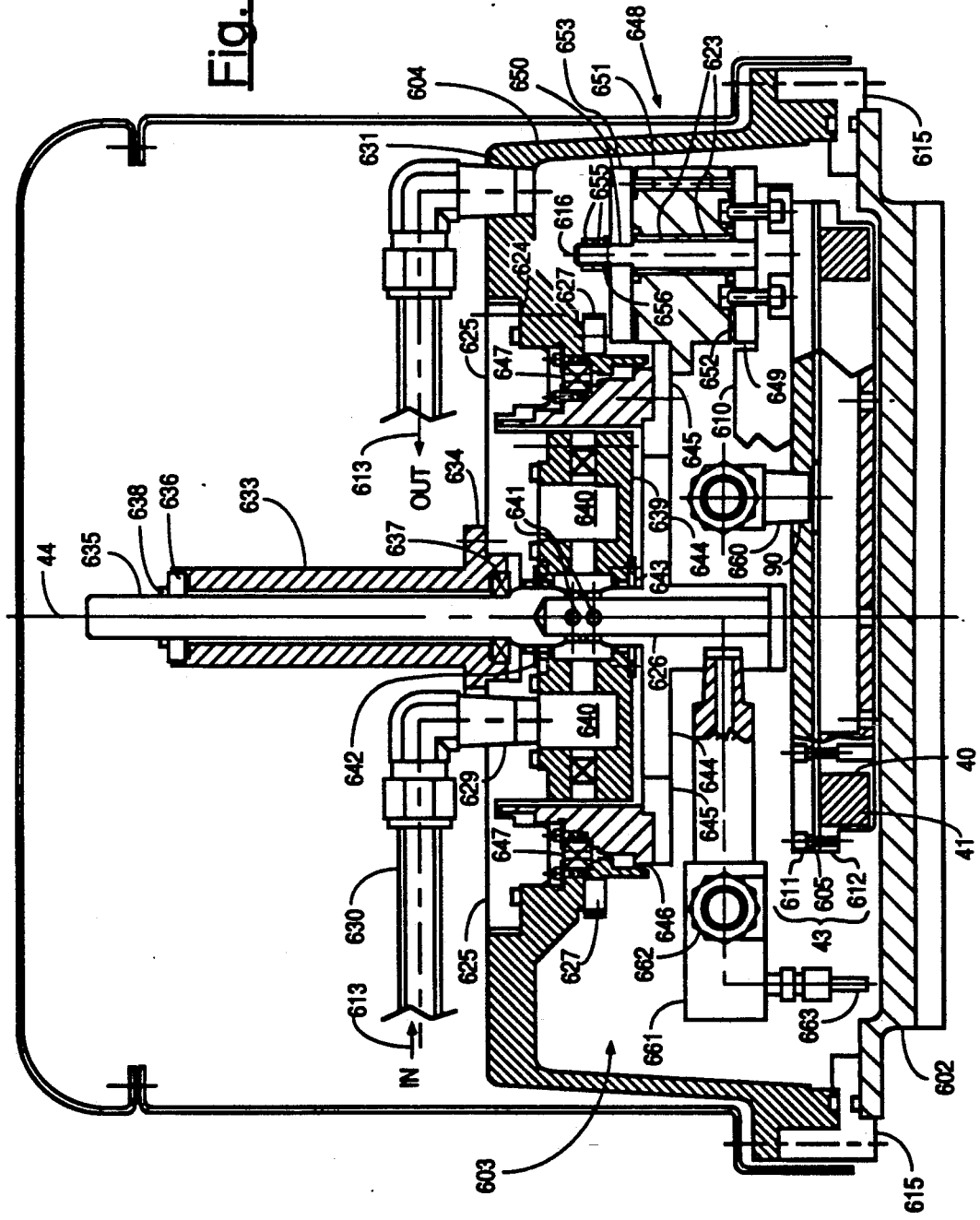
FIG. 6 shows a cross-sectional view of a magnetron sputtering apparatus in accordance with an embodiment of the present invention.
Figure 7:
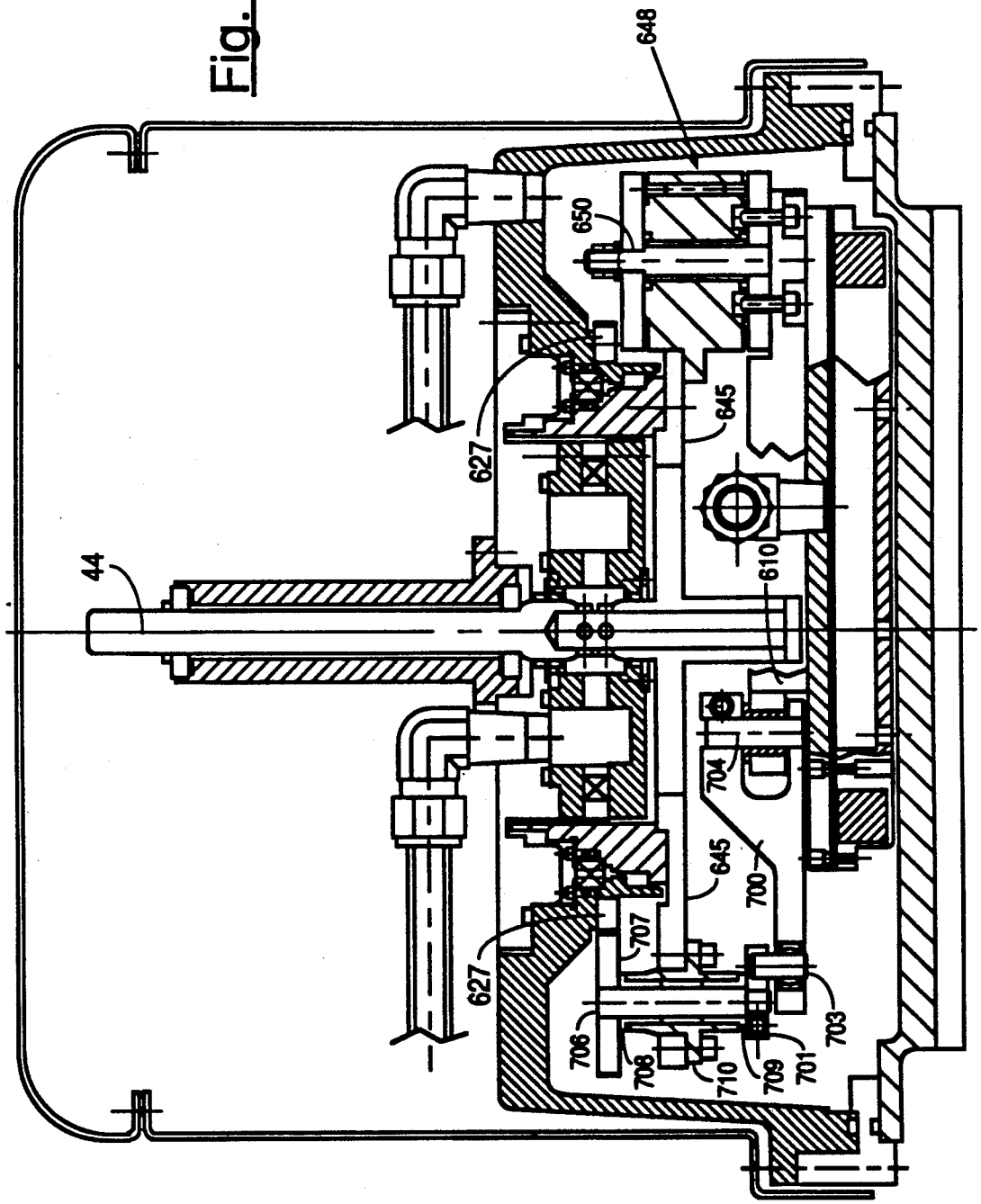
FIG. 7 shows a second cross-sectional view of the magnetron sputtering apparatus of FIG. 6, with half of the cross-section being rotated through a 90° angle.

In the magnetron sputtering apparatus of FIG. 6, a sputtering target 600 is mounted on a front side 601 of a target backing plate 602 having a rotating mechanism 603 mounted within a coolant chamber 604. Rotating mechanism 603 includes magnet housing assembly 43 containing magnets 41 forming magnet track 40. Magnet housing assembly 43, which is eccentrically mounted on rotating mechanism 603, is rotated about central axis 44 of target 600 and coolant chamber 604. As magnet housing assembly 43 is rotated by rotating mechanism 603, it oscillates through an arc between its "swept in" position and its "swept out" position. This oscillating motion is accomplished by means of a magnet assembly support plate 610 (only a portion of which is shown in FIG. 6), a drive link 700 and a crank shaft 701 (FIG. 7). Magnet housing assembly 43 consists of a magnet housing cover 611 beneath which is mounted a magnet housing body 612. A gasket 605 separates and seals magnet housing cover 611 and magnet housing body 612.

Figure 8:
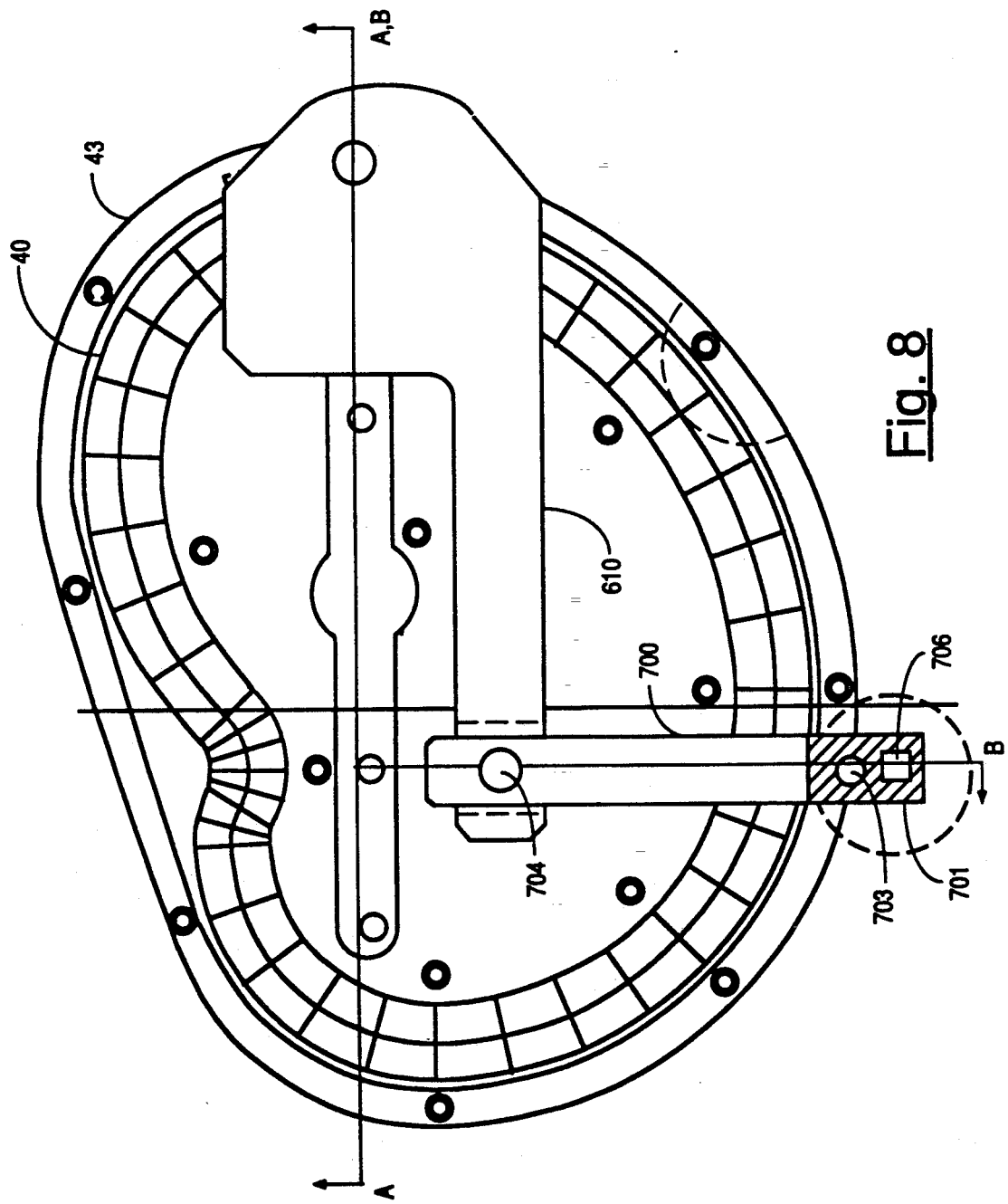
FIG. 8 is a plan view of the oscillatory or wobbling mechanism of the invention.

A top view of the elements associated with magnet housing assembly 43 is shown in FIG. 8, which also defines the cross sections shown in FIGS. 6 and 7. FIG. 6 is a view at cross section A—A in FIG. 8. FIG. 7 is a view at cross section B—B in FIG. 8. An examination of FIGS. 7 and 8 indicates how magnet housing assembly 43 is caused to oscillate or "wobble" back and forth as crank shaft 701 and a shaft 703 rotate about a gear shaft 706. The rotational movement of shaft 703 is converted into an oscillatory motion by drive link 700, which is connected to magnet assembly support plate 610 by a shaft 704. The means by which this oscillatory motion is created is further described below.

Returning to FIG. 6, coolant chamber 604 and rotating mechanism 603 are mounted on top of a magnetron sputtering chamber (not shown). A top insulating ring 615, target backing plate 602 and coolant chamber 604 are bolted together and provided with appropriate sealing rings to prevent leakage of liquid coolant 613.

Coolant chamber 604 has a top shoulder 624 upon which a coolant chamber cover 625 rests. Coolant chamber cover 625 is circular and completely covers the top of coolant chamber 604. A relatively large gear 627 (see FIG. 9) is mounted with bolts on coolant chamber 604. Relatively large gear 627 contains 256 gear teeth extending away from the center of coolant chamber 604.

Coolant chamber cover 625 has a coolant inlet opening 629 which provides an inlet for liquid coolant 613. Coolant inlet opening 629 is connected to a conduit 630 which carries the incoming liquid coolant 613.

A coolant injection housing 639 is mounted in a position surrounding a hollow drive shaft 635 on the underneath side of coolant chamber cover 625. Coolant inlet opening 629 feeds into a cavity 640 in coolant injection housing 639, thereby allowing liquid coolant 613 to flow into holes 641 in hollow drive shaft 635. There are a total of eight holes 641 spaced at right angles around the circumference of drive shaft 635. Seal-containing channels (unnumbered to preserve clarity) are included at the top and bottom surfaces, respectively, of coolant injection housing 639 adjacent the surface of drive shaft 635. These channels contain circular ring seals having a U-shaped cross section, the opening of the "U" in each seal facing toward cavity 640. The uppermost U-shaped seal is retained in its channel by a separator plate 642 and the lower U-shaped seal is retained in its channel by a seal cover 643. The U-shaped seals accordingly provide a seal with drive shaft 635 when it is rotating so that liquid coolant flowing into coolant injection housing 639 from coolant inlet opening 629 is directed solely through holes 641 into a central cavity 626 in the lower portion of drive shaft 635. Additional seals are provided in channels formed in coolant chamber cover 625 to prevent leakage between coolant chamber cover 625 and coolant injection housing 639. These channels are shown in FIG. 6 but are not numbered to preserve the clarity of the drawing.

Coolant chamber 604 has a coolant outlet opening 631 which connects to an outlet conduit 632.

Coolant chamber cover 625 has at its center a hole into which a shaft support 633 is fitted. Shaft support 633 has a lower flange 634 which is attached to the top surface of coolant chamber cover 625. The axis of shaft support 633 coincides with central axis 44, as does the axis of a drive shaft 635 which is journalled into respective ball bearings 636 and 637 at the ends of shaft support 633. A collar 638 provides vertical support for drive shaft 635.

Drive shaft 635 extends above shaft support 633 and collar 638 to a coupling which connects it to a motor (not shown).

Figure 9:
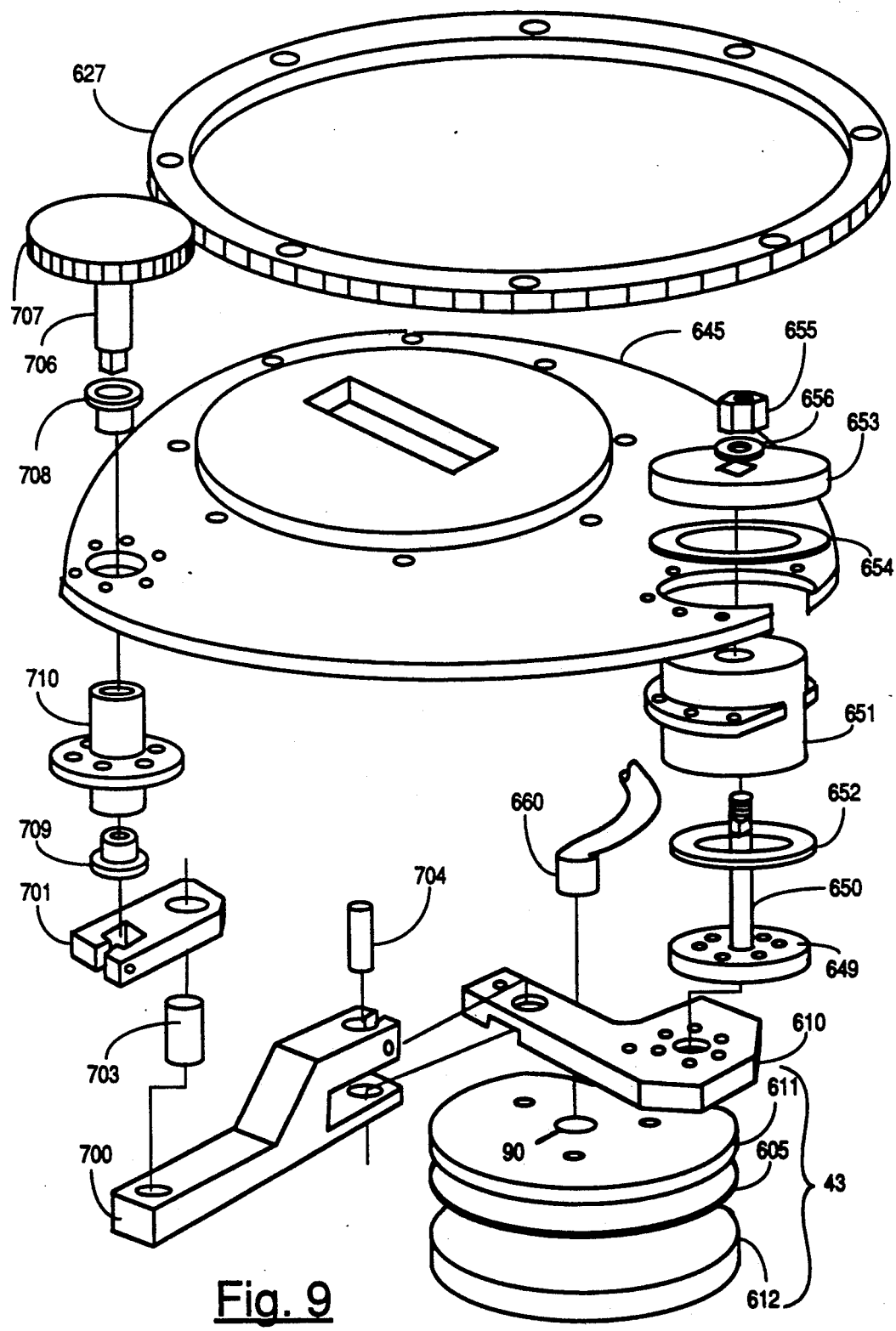
FIG. 9 is an exploded view of a portion of the magnetron sputtering apparatus of FIG. 6.
Figure 10:
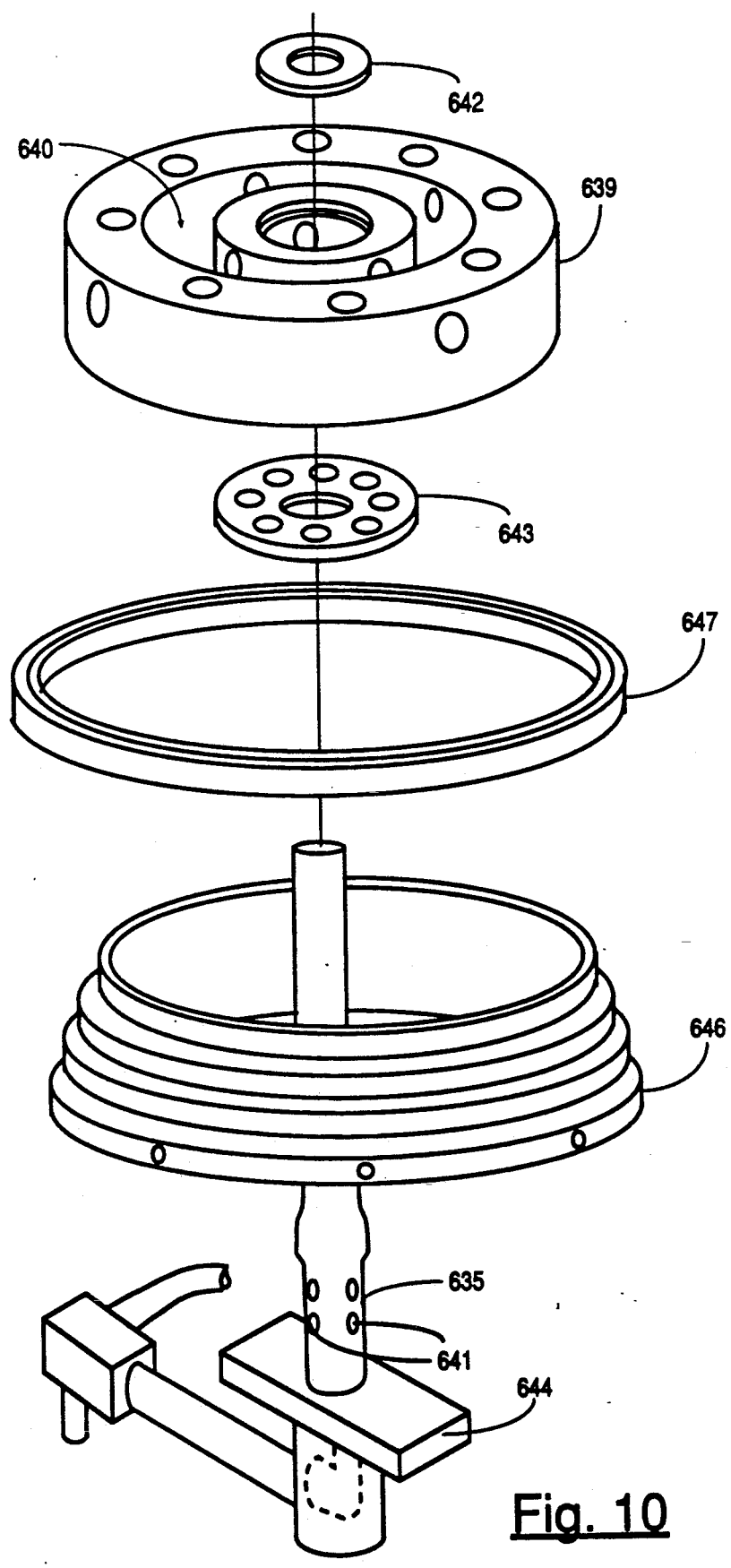
FIG. 10 is an exploded view of another portion of the magnetron sputtering apparatus of FIG. 6.
Figure 11:
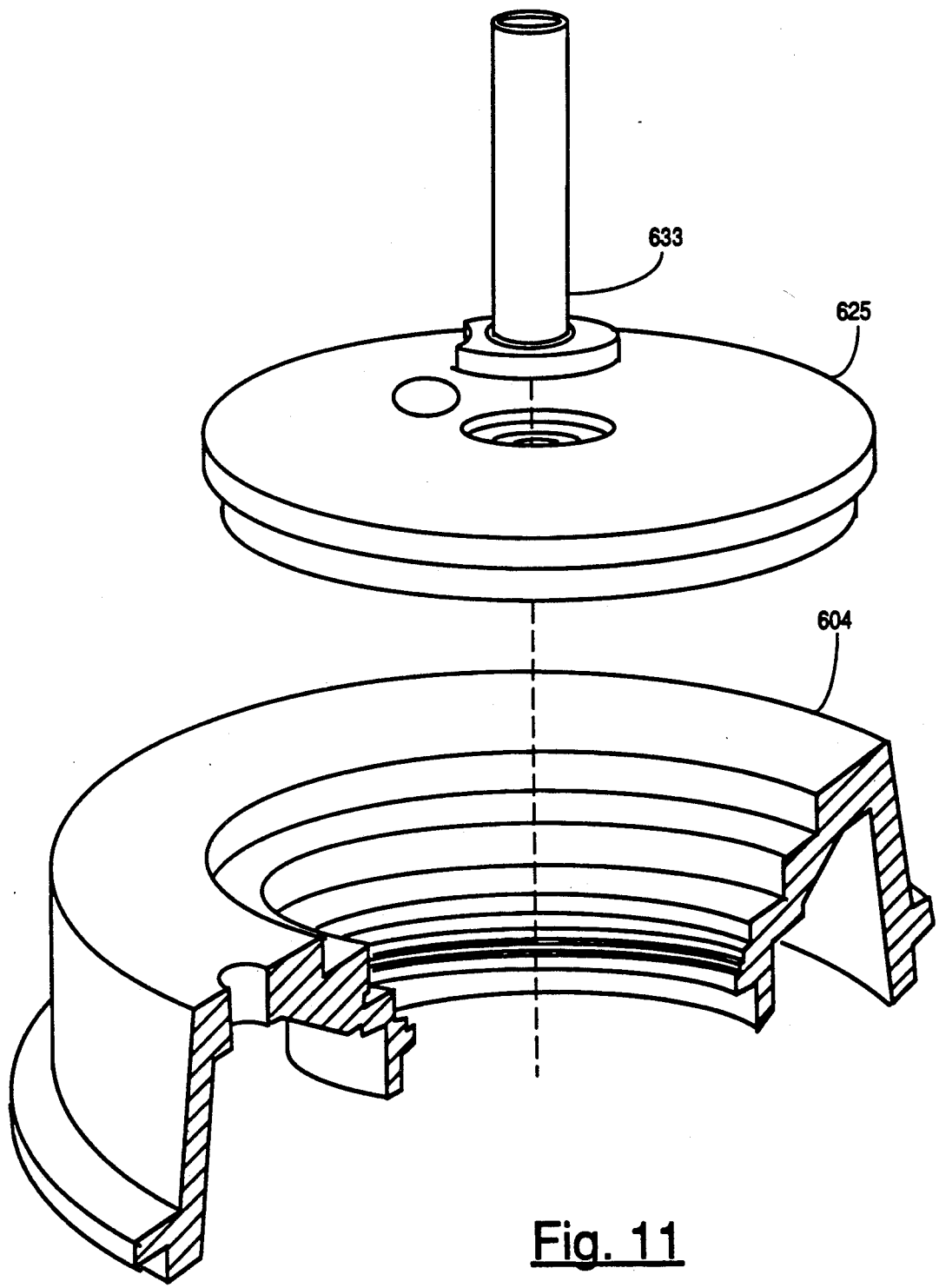
FIG. 11 is an exploded view of another portion of the magnetron sputtering apparatus of FIG. 6.

A rectangular element 644 is formed around the lower portion of drive shaft 635. Rectangular element 644 is fitted into a rectangular opening in a drive plate 645, which is best shown in FIG. 9. A bearing tube 646 is attached to the top surface of drive plate 645. Rectangular element 644 and bearing tube 646 are best seen in FIG. 10. The inner diameter of bearing tube 646 is designed so that coolant injection housing 639 just fits inside bearing tube 646. A large circular bearing 647 is mounted with its inner race bolted to bearing tube 646 and with its outer race bolted to an inner circumference of coolant chamber 604. As a result, the unit consisting of drive plate 645 and bearing tube 646 is capable of rotating on large circular bearing 647. This unit is connected to drive shaft 35 via rectangular element 644. Drive shaft 35 receives lateral support from ball bearings 636 and 637. Coolant injection housing 639, coolant chamber cover 625 and coolant chamber 604 remain stationary.

A pivot plate assembly 648 is mounted at one side of drive plate 645, as shown in FIGS. 6, 7 and 9. Pivot plate assembly 648 includes a pivot block 651, which has a flange bolted to the underside of drive plate 645. A shaft 650 is free to rotate about an axis 616 inside bushings 623 in pivot block 651. A circular pivot plate 649 is coaxially attached to the lower end of shaft 650 and is bolted to the top surface of magnet assembly support plate 610. Pivot plate 649 is free to rotate with respect to pivot block 651 on a thrust bearing 652. A square section near the upper end of shaft 650 fits into a square hole in a second pivot plate 653, insuring that relative rotation does not occur between pivot plate 649 and pivot plate 653. This end of shaft 650 is threaded and nuts 655 are secured to this end. Belleville washers 656 are placed around shaft 650 under nuts 655. A second thrust bearing 654 separates pivot plate 653 from pivot block 651. The resulting structure allows shaft 650, pivot plate 653 and pivot plate 649 to rotate as a unit with respect to pivot block 651 and thereby allows rotational motion to occur between drive plate 645 and magnet assembly support plate 610 about axis 616 of shaft 650.

The oscillatory or "wobbling" drive mechanism will now be described, with particular reference to FIGS. 7, 8 and 9. As previously noted, drive link 700 is allowed to pivot with respect to magnet assembly support plate 610 by means of shaft 704. Shaft 703 is journalled into the other end of drive link 700 and into crank shaft 701. The opposite end of crank shaft 701 contains a square hole for receiving the square end of gear shaft 706 which is attached coaxially to a smaller gear 707, which has 60 teeth. Shaft 706 is journalled into bushings 708 and 709, which are fitted into the opposite ends of a housing 710. Housing 710 is bolted to drive plate 645. The square end of shaft 706 is fitted into the square hole of crank shaft 701 and fastened with a screw (not shown).

The proportions of the foregoing elements are such that when housing 710 is bolted to drive plate 645, the teeth of smaller gear 707 mesh with the teeth of relatively large gear 627. Relatively large gear 627 is attached to coolant chamber 604, which remains stationary when the apparatus is in operation. When shaft 635 and drive plate 645 rotate, shaft 706 and smaller gear 707 also rotate about central axis 609. The meshing of the teeth of relatively large gear 627 and smaller gear 707 causes smaller gear 707 to rotate about shaft 706. This in turn causes crank shaft 701 to rotate about shaft 706, and by the process described previously this rotational motion is translated into an oscillatory or "wobbling" motion of magnet assembly support plate 610 and magnet housing assembly 606.

Magnet housing assembly 43 includes magnet housing body 612 having magnet track 40 and a cooling channel 49 formed therein, with a magnet housing cover 611 enclosing both the magnet track 40 and the cooling channel 49 (FIGS. 4 and 6). Magnet track 40 and cooling channel 49 are formed in the top side of magnet housing body 612. Magnet track 40 has a uniform rectangular shape at any given cross section perpendicular to the center line of the channel. Each of magnet subgroups 42a–42g contains individual magnets which are similar in to each other.

Cooling channel 49 in magnet housing body 612 is linear and has a rectangular cross section at any point perpendicular to the center line of the channel. The bottom surface of cooling channel 49, facing target backing plate 602, contains a series of four holes 48 capable of directing a spray of liquid coolant 613 at target backing plate 602.

Magnet housing cover 611 covers and seals cooling channel 49. Gasket 605 assures that when magnet housing cover 611 is firmly attached to magnet housing body 612 by bolts or other reliable means, magnet track 40 is sealed against leakage from any direction. Cooling channel 49 is likewise sealed to assure that flow of all liquid coolant 613 is out through holes 48.

A coolant connecting hole 90 is provided in magnet housing cover 611 to accommodate a coolant inlet fitting 660 (FIGS. 6 and 9). The location of coolant connecting hole 90 matches the location of cooling channel 49 in magnet housing body 612 in such a way that when liquid coolant 613 passes through inlet coolant fitting 660 and coolant connecting hole 90, it goes directly into cooling channel 49.

Cavity 626 in the lower portion of drive shaft 635 is attached to a coolant arm 661 such that liquid coolant 613 may flow from cavity 626 into coolant arm 661. Coolant arm 661 is connected to a coolant fitting 662 and a nozzle 663. A length of flexible tubing (not shown) is connected between fitting 660 and fitting 662 such that coolant flowing out of cavity 626 may flow into cooling channel 49 and through nozzle 663.

Liquid coolant 613 is thereby routed and injected through holes 48 into coolant chamber 604 in the space between the back side of target backing plate 602 and the front face of magnet housing assembly 43. Liquid coolant 613 also flows out through nozzle 663. The flow of liquid coolant 613 past the back of target backing plate 602 is preferably turbulent, which will enhance the heat transfer process.

The magnetic field created by magnets 41 concentrates the sputtering action and to a lesser extent the heat generated by the sputtering action in the path traced by the magnets in target backing plate 602. While the sputtering action is instantaneous and localized, causing hot spots on the surface of target backing plate 602, the heat the sputtering generates, as it is conducted through target 600 and target backing plate 602, is spread to an area much larger than those localized hot spots and reaches the back of target backing plate 602 at a predetermined time after the magnets have already moved to another location. Liquid coolant 613 is routed and directed toward target backing plate 602 such that the liquid coolant with the lowest temperature is routed and directed at the back of target backing plate 602 in an area where the backing plate's temperature would rise without this cooling.

The mechanical operation of the elements shown in FIGS. 6 and 7 can be summarized as follows. As drive shaft 635 rotates, this rotary motion is imparted via drive plate 645 and shaft 706 to smaller gear 707, and via pivot plate assembly 648 and magnet assembly support plate 610 to magnet housing assembly 43. Magnet housing assembly 43 accordingly rotates about central axis 44. Simultaneously, smaller gear 707, whose teeth are meshed with those of relatively large gear 627, rotates about shaft 706. This causes crank shaft 701 to rotate, producing a circular movement in shaft 703. This in turn causes drive link 700 to oscillate or "wobble" back and forth, and this oscillating movement is transmitted via shaft 704 to magnet assembly support plate 610 and thereby to magnet housing assembly 43. Magnet housing assembly 43 therefore oscillates in an arc about shaft 650 in pivot plate assembly 648.

At the same time, liquid coolant 613 flows through conduit 630 and coolant inlet opening 629 into cavity 640 in coolant injection housing 639. Liquid coolant 613 is then conducted through holes 641 into cavity 626 of drive shaft 635 from which it flows into coolant arm 661. From coolant arm 661 the coolant flows through two paths: (i) out of nozzle 663 and (ii) through fitting 662 and the flexible tubing (not shown) into fitting 660 and cooling channel 49 and out through holes 48. The coolant level in coolant chamber 604 continues to rise until it flows out coolant outlet opening 631 and through outlet conduit 632 to its destination. The flexible tubing (not shown) between fittings 660 and 662 accommodates the oscillatory motion of magnet housing assembly 43 with respect to coolant arm 661.

Figure 12:
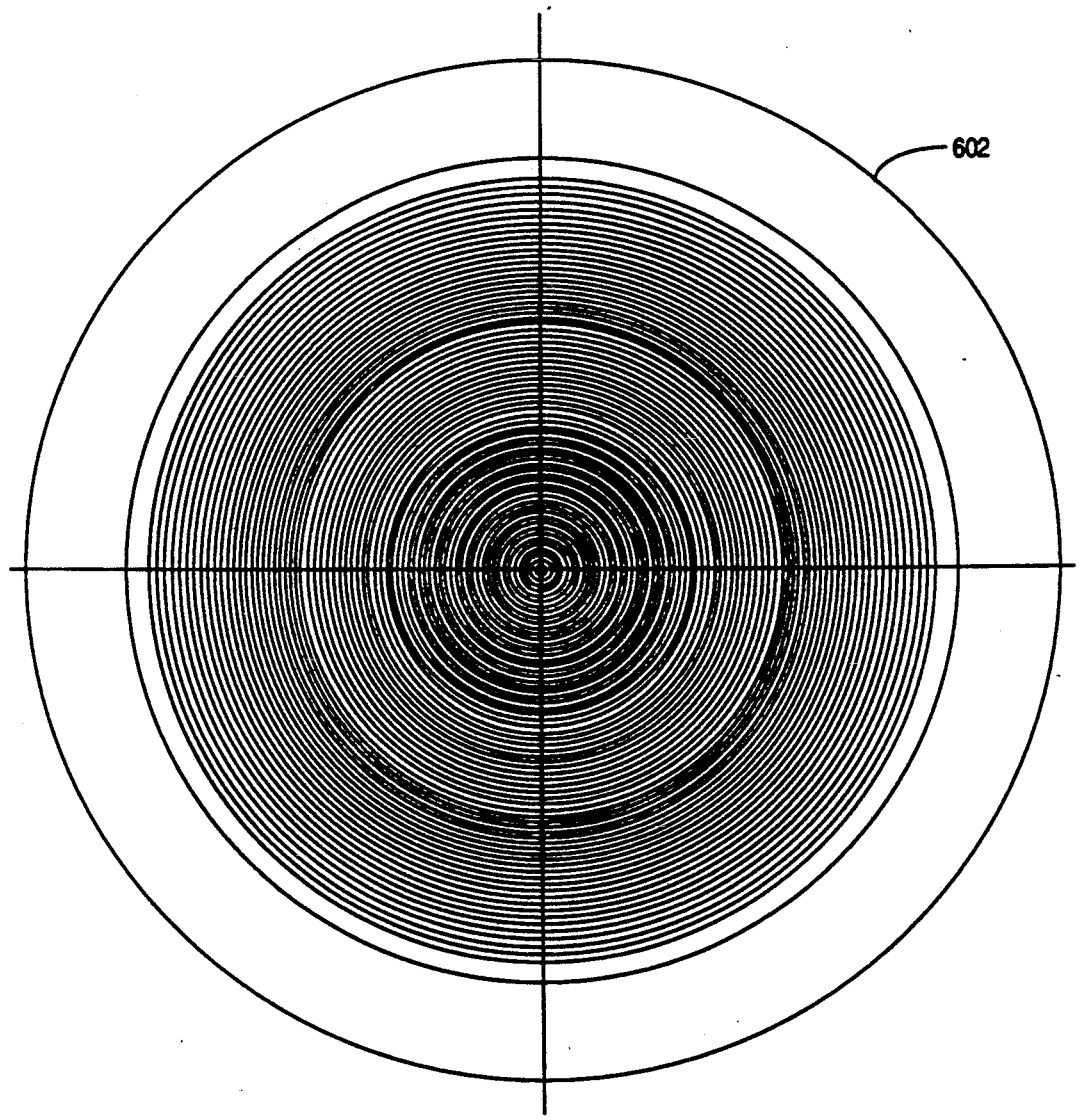
FIG. 12 shows the ribbed pattern of the surface of the target backing plate.

Coolant 613 which is sprayed from nozzle 663 and the respective holes 48 cools target backing plate 602 and target 600. The rotational movement of rotating mechanism 603 assures that liquid coolant 613 in coolant chamber 604 is kept in constant motion to avoid the development of hot spots in target backing plate 602 or target 600. In this manner, the thermal energy generated by the sputtering action is dissipated by the injection of liquid coolant 613 which is routed directly to the back side of target backing plate 602. The heat transfer from target backing plate 602 is improved by forming a series of concentric ribs or fins on the side of target backing plate which faces coolant chamber 604, as shown in FIG. 12.

Figure 13:
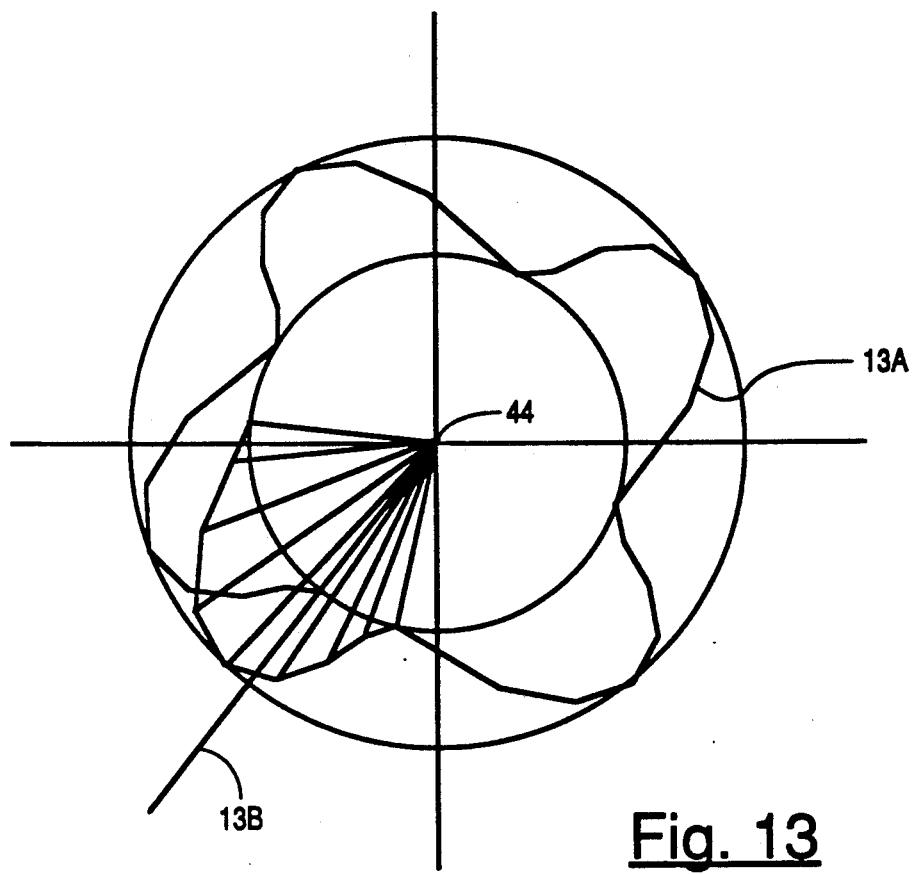
FIG. 13 shows the path of the magnet track as it moves through slightly more than one revolution about the center of the target.

FIG. 13 shows a tracing 13A of the path of shaft 704 as drive shaft 635 moves through slightly more than one revolution. Since the location of shaft 704 is fixed with respect to magnet housing assembly 43, the motion of shaft 704 is representative of the motion of magnet housing assembly 43. A radial reference line 13B defines a beginning and an end of one full revolution of drive shaft 635. At the beginning of the revolution shaft 704 is at a location where magnet housing assembly 43 is at a "swept in" position, i.e., closest to central axis 44. It should be noted that, as shown in FIG. 13, the motion of shaft 704 and magnet housing assembly 43 does not immediately repeat itself. The number of teeth in smaller gear 707 and relatively large gear 627 (60 and 256, respectively) are selected to avoid a short cycling time, i.e., 15 full revolutions of smaller gear 707 are necessary before any selected reference tooth on relatively large gear 627 will once again contact a similar reference tooth on smaller gear 707. FIG. 13 shows a tracing of the motion of shaft 704 during five revolutions of smaller gear 707 with respect to its contact with relatively large gear 627. As can be seen, it takes approximately 4.27 revolutions of smaller gear 707 to complete one revolution around the circumference of relatively large gear 627. This ratio is not critical, however. A wide variety of ratios may be employed with satisfactory results.

The rotating and oscillating motions of magnet housing assembly 43 and magnet track 40 provide a substantially uniform magnet flux dwell time over a substantial portion of target 600. As a result, a major part of the target is uniformly eroded for achieving high material utilization. Moreover, good deposition uniformity is realized on wafers measuring, for example, 8 inches in diameter, from a target 600 measuring 14.75 inches in diameter. As a result of this uniform magnet field coverage, hot spots do not develop in the target backing plate 602, thereby enabling the power levels for sputtering to be increased over levels used in the prior art. The increased power levels increase the rate at which the sputtered material is deposited on the wafer and thereby provide greater efficiency and throughput.

Figure 14:
FIG. 14 is a cross-sectional view of the erosion pattern of the target.

FIG. 14 is a cross-sectional view illustrating the erosion of target 600 from central axis 44 to its circumference after approximately 1390 kW-hr of sputtering. As indicated, target 600 is slightly more than 14 inches in diameter. Erosion is fairly constant from about 1 inch to about 6 inches, with a groove, however, at approximately 5¾ inches. An important feature is that some sputtering occurs throughout target 600, including at central axis 44 as well as at the perimeter of the target. This means that the flaking of back-scattered target material to contaminate the wafer will not occur. The sputtering apparatus of this invention has been found to provide a highly uniform deposition pattern, with variations of 1.5% (1 sigma, standard deviation) or less on large wafers up to 8 inches in diameter.

While a specific embodiment of the invention has been described, the combined rotational and oscillatory motion of target 600 may be achieved in a number of different ways. Hydraulic, electro-mechanical and other types of apparatus may be used to achieve this motion in addition to the mechanical apparatus described herein. Moreover, the position of magnet track 600 may be varied somewhat in any direction, and the oscillatory motion may be about a pivot point other than the one shown in FIG. 4 or magnet track 40 may oscillate linearly as well as through an arc about a pivot point. While the curve on which magnet track 40 is based was generated by allowing θ to increase from 0° to 270°, these limits may also be varied without departing from the scope of the invention. Accordingly, these and other embodiments, variations and improvements not described herein are to be considered within the scope of this invention as defined by the following claims.

We claim:

1. A magnetron sputtering apparatus for providing a magnetic flux over an essentially planar surface, comprising:

a magnet track having essentially the form of a planar closed curve in the shape of a kidney bean, said magnet track being suitable for achieving a substantially uniform magnetic flux dwell time in an annular region of said surface when rotated about a predetermined axis of rotation perpendicular to said surface;

means for rotating said magnet track behind said planar surface about said axis of rotation, the plane of said magnet track being parallel to said planar surface; and means for simultaneously provided said magnet track with an oscillatory motion between a swept in extreme and a swept out extreme, said closed curve surrounding said axis of rotation when said magnet track is at said swept out extreme.

2. The magnetron sputtering apparatus of claim 1 wherein said oscillatory motion occurs over a path defining an arc of a circle.

3. The magnetron sputtering apparatus of claim 2 wherein said magnet track intersects said axis of rotation when said magnet track is at said swept in extreme.

4. The magnetron sputtering apparatus of claim 3 wherein the period of said rotation is not an integral multiple of the period of said oscillatory motion, and the period of said rotation is greater than the period of said oscillatory motion.

5. The magnetron sputtering apparatus of claim 3 wherein the period of said oscillatory motion is not an integral multiple of the period of said rotation, and the period of said oscillatory motion is greater than the period of said rotation.

6. The magnetron sputtering apparatus of claim 5 wherein a portion of said magnet track is essentially in the form of a curve defined by the expression:

$$\theta = \sin^{-1}\left(\frac{1}{r}\right) + \sqrt{r^2 - 1} + C$$

plotted in polar coordinates, where r is the radius, θ is the angle, and $C = -\pi/2$.

7. The magnetron sputtering apparatus of claim 1 wherein the form of said magnet track is essentially the form of the closed figure shown in FIG. 3.

8. The magnetron sputtering apparatus of claim 1 wherein said magnet track comprises a continuous inner edge having a magnetic pole of a first polarity, and a continuous outer edge having a magnetic pole of an opposite polarity.

9. The magnetron sputtering apparatus of claim 8 wherein said magnet track comprises a plurality of magnets having respective north poles disposed at the outer edge of said magnet track and having respective south poles disposed at the inner edge of said magnet track.

10. The magnetron sputtering apparatus of claim 9 wherein said rotating means comprises:

a drive shaft; and a rotating mechanism connected to said drive shaft; and wherein said means for providing an oscillatory motion comprises:

a magnet assembly support plate;

a pivot plate assembly connected to said rotating mechanism and to said magnet assembly support plate, respectively, so as to allow relative rotational motion between said rotating mechanism and magnet assembly support plate;

a drive link, one end of said drive line being rotatably connected to said magnet assembly support plate;

a smaller gear in engagement with a relatively large gear mounted in said magnetron sputtering apparatus;

a gear shaft, one end of said gear shaft being fixably connected to said smaller gear; and a crank shaft, one end of said crank shaft being fixably connected to the other end of said gear shaft and the other end of said crank shaft being rotatably connected to the other end of said drive link.

11. The magnetron sputtering apparatus of claim 1 wherein said oscillatory motion occurs in a straight line.

12. The magnetron sputtering apparatus of claim 1 wherein a magnetic flux is provided at a point of intersection between said planar surface and said axis of rotation when said magnet track is at said swept in extreme.

13. A magnetron sputtering apparatus for providing a magnetic flux over a planar surface, comprising:
a housing;
a magnet track generally disposed in said housing, said magnet track being in the form of a closed loop having;
a first segment being adapted to provide a substantially uniform magnetic flux dwell time throughout an annular region of said surface when rotated about a center of rotation;
a second segment being adapted to provide a substantially uniform magnetic flux dwell time throughout an annular region of said surface when rotated about said center of rotation, said first and second segments being connected with each other so as to form a closed loop;
means for rotating said magnet track about said center of rotation; and
means for simultaneously causing said magnet track to oscillate between a swept in extreme and a swept out extreme, said closed loop surrounding said center of rotation when said magnet track is at said swept out extreme;
wherein said first segment is essentially in a form defined by the equation:

$$\theta = \sin^{-1}\left(\frac{1}{r}\right) + \sqrt{r^2 - 1} + C$$

plotted in polar coordinates, where r is the radius, $\theta$ is the angle, and $C = -\pi/2$, with $\theta$ being turned from about 0 degrees to an angle in the range of 180 degrees to about 270 degrees.

14. The magnetron sputtering apparatus of claim 13 wherein $\theta$ is turned from about 0 degrees to about 270 degrees.

15. The magnetron sputtering apparatus of claim 13 wherein said magnet track oscillates over a path defining an arc of a circle.

16. The magnetron sputtering apparatus of claim 13 wherein a section of said magnet track is located substantially above said center of rotation when said oscillatory motion is at said swept in extreme.

17. A method for providing a substantially uniform magnetic flux over a target of a magnetron sputtering apparatus, comprising the steps of:
movably mounting behind said target a magnet track having the property of providing a substantially uniform magnetic flux in an annular region over said magnet track when said magnet track is rotated about a fixed center of rotation, said magnet track being in the form of a closed figure having the shape of kidney bean;
rotating said magnet track about an axis perpendicular to said target, with said magnet track surrounding said axis; and
superimposing on the rotating magnet track an oscillating motion in a direction substantially perpendicular to said axis.

18. The method of claim 17 wherein said oscillating motion occurs between an extreme swept in position and an extreme swept out position, said magnet track intersecting said axis when said magnet track is at said extreme swept in position.

19. The method of claim 18 wherein said oscillating motion occurs over an arc of a circle.

20. A magnetron sputtering apparatus for providing a magnetic flux over a planar surface, comprising:
a housing;
a magnetic track generally disposed in said housing, said magnet track being in the form of a closed loop having a first segment including a spiral curve extending outward from a point of origin and turning more than 180 degrees but less than 360 degrees from said point of origin, said first segment having respective ends and being adapted to provide a substantially uniform magnetic flux dwell time throughout an annular region of said planar surface when rotated about a center of rotation; and
a second segment connecting said ends of first segment; and
means for rotating said magnet track about an axis of magnet track rotation, while simultaneously causing said magnet track to oscillate in a direction substantially radial to said axis of magnet track rotation said magnet track surrounding or intersecting said axis at all times while said magnet track is rotating and oscillating.

21. The magnetron sputtering apparatus of claim 20 wherein said first segment includes a spiral curve extending outward from a point of origin and turning approximately 270 degrees from said point of origin.

* * * * *